US009368358B2

(12) United States Patent
Harada et al.

(10) Patent No.: US 9,368,358 B2
(45) Date of Patent: Jun. 14, 2016

(54) METHOD OF MANUFACTURING A SEMICONDUCTOR DEVICE

(71) Applicant: HITACHI KOKUSAI ELECTRIC INC., Tokyo (JP)

(72) Inventors: Kazuhiro Harada, Toyama (JP); Arito Ogawa, Toyama (JP); Motomu Degai, Toyama (JP); Masahito Kitamura, Toyama (JP); Hiroshi Ashihara, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/832,496

(22) Filed: Aug. 21, 2015

(65) Prior Publication Data

US 2016/0056044 A1    Feb. 25, 2016

(30) Foreign Application Priority Data

Aug. 21, 2014   (JP) .................. 2014-168233

(51) Int. Cl.
*H01L 21/38* (2006.01)
*H01L 21/285* (2006.01)
*H01L 21/28* (2006.01)
*H01L 49/02* (2006.01)

(52) U.S. Cl.
CPC .... *H01L 21/28556* (2013.01); *H01L 21/28088* (2013.01); *H01L 21/28568* (2013.01); *H01L 28/60* (2013.01)

(58) Field of Classification Search
CPC .................. H01L 21/28556; H01L 21/28568; H01L 21/0227; H01L 21/28506
USPC ................................ 438/656, 763
See application file for complete search history.

(56) References Cited

U.S. PATENT DOCUMENTS

| 8,951,912 | B2 | 2/2015 | Ogawa et al. | |
|---|---|---|---|---|
| 9,012,323 | B2 | 4/2015 | Ogawa et al. | |
| 2010/0297846 | A1 | 11/2010 | Kaga et al. | |
| 2011/0031593 | A1* | 2/2011 | Saito | C23C 16/34 257/632 |
| 2011/0059600 | A1* | 3/2011 | Sakai | B08B 7/00 438/584 |
| 2011/0183519 | A1* | 7/2011 | Kaga | C23C 16/34 438/680 |
| 2013/0095668 | A1* | 4/2013 | Saito | C23C 16/45534 438/758 |
| 2014/0342573 | A1 | 11/2014 | Hirose et al. | |
| 2015/0200102 | A1 | 7/2015 | Ogawa et al. | |
| 2015/0200103 | A1 | 7/2015 | Ogawa et al. | |
| 2015/0200104 | A1 | 7/2015 | Ogawa et al. | |
| 2016/0056037 | A1* | 2/2016 | Thombare | H01L 21/02186 438/770 |

FOREIGN PATENT DOCUMENTS

JP        2011-006783 A       1/2011

* cited by examiner

*Primary Examiner* — Trung Q Dang
(74) *Attorney, Agent, or Firm* — Volpe and Koenig, P.C.

(57) ABSTRACT

A method of manufacturing a semiconductor device includes: (a) supplying a halogen-based source gas containing a first element to a substrate; (b) supplying a reaction gas containing a second element to react with the first element to the substrate; (c) forming a first layer containing the first element and the second element by time-dividing and performing (a) and (b) a predetermined number of times; (d) supplying an organic source gas containing the first element to the substrate; (e) supplying the reaction gas to the substrate; (f) forming a second layer containing the first element and the second element by time-dividing and performing (d) and (e) a predetermined number of times; and (g) forming a thin film containing the first element and the second element on the substrate by time-dividing and performing (c) and (f) a predetermined number of times.

11 Claims, 8 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device.

2. Description of the Related Art

With the increasing degree of integration and increasing performance of semiconductor devices such as a metal-oxide-semiconductor field-effect transistor (MOSFET), various types of metal films are used as electrodes, wires, and the like. Among them, for a gate electrode or a capacitor electrode of a dynamic random access memory (DRAM), a metal carbide-based or metal nitride-based metal film is often used in terms of oxidation resistance, electric resistivity, a work function, and the like (JP 2011-6783 A).

SUMMARY OF THE INVENTION

Important parameters indicating MOSFET characteristics include a threshold voltage (Vth). The threshold voltage is determined by the work function of an electrode. In recent years, an electrode having a metal film that can be adjusted in the work function to various values according to its use has sometimes been required.

An object of the present invention lies in providing a technology that allows for adjustment of the work function of a metal film.

According to an aspect of the present invention, there is provided a method of manufacturing a semiconductor device that includes: (a) supplying a halogen-based source gas containing a first element to a substrate; (b) supplying a reaction gas containing a second element to react with the first element to the substrate; (c) forming a first layer containing the first element and the second element by time-dividing and performing (a) and (b) a predetermined number of times; (d) supplying an organic source gas containing the first element to the substrate; (e) supplying the reaction gas to the substrate; (f) forming a second layer containing the first element and the second element by time-dividing and performing (d) and (e) a predetermined number of times; and (g) forming a thin film containing the first element and the second element on the substrate by time-dividing and performing (c) and (f) a predetermined number of times.

The present invention can provide a technology that allows for adjustment of the work function of a metal film.

DESCRIPTION OF EMBODIMENTS

Figure 1:
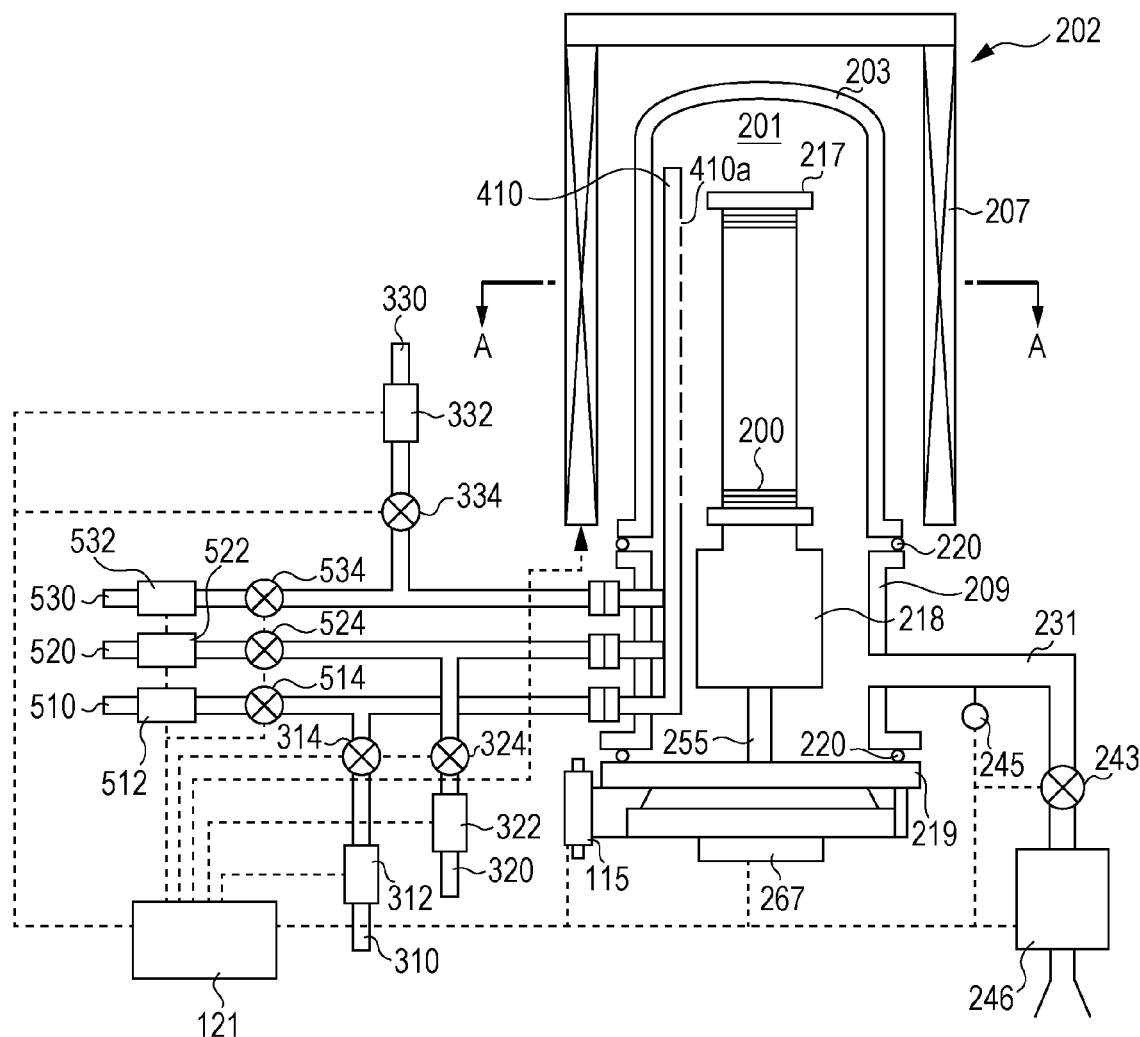
FIG. 1 is a schematic configuration diagram of a processing furnace of a substrate processing apparatus preferably used in an embodiment of the present invention, a diagram illustrating a processing furnace portion in a longitudinal section.

For transistors, a P-type transistor and an N-type transistor require different work functions. Generally, a P-type transistor requires 5.0 eV or more, and an N-type transistor 4.3 eV or less. They may require other values, depending on their uses. In such a case, it is desirable that a work function can be adjusted (controlled, modulated, or tuned) by a single film having the same element composition. The work function of an electrode can be adjusted by a metal film constituting the electrode. For example, when a titanium nitride film (TiN film) is formed on a substrate as a metal film, by adjusting (controlling, modulating, or tuning) the concentration of carbon (C) or nitride (N) contained in the TiN film to change the crystallinity, the barrier properties can be increased. Thus it becomes possible to form an electrode made of a metal film having a desired work function by controlling the concentration of C or N contained in a TiN film to adjust the work function.

First Embodiment of the Present Invention

Hereinafter, a preferred first embodiment of the present invention will be described with reference to FIGS. 1 and 2. A substrate processing apparatus 10 is configured as an example of an apparatus used in a substrate processing process as a step of a semiconductor device manufacturing process.

(1) Processing Furnace Configuration

A processing furnace 202 is provided with a heater 207 as a heating means (heating mechanism or heating system). The heater 207 is configured in a cylindrical shape with the top closed.

Inside the heater 207, a reaction tube 203 constituting a reaction container (processing container) is arranged concentrically with the heater 207. The reaction tube 203 is made from a heat resistant material or the like (e.g., quartz ($SiO_2$) or silicon carbide (SiC)), and is formed in a cylindrical shape with the top closed and the bottom opened.

To the bottom of the reaction tube 203, a manifold 209 made from a metal material such as stainless is attached. The manifold 209 is formed in a tubular shape, and is hermetically closed at its bottom opening by a seal cap 219 as a lid. O-rings 220 are individually provided between the reaction tube 203 and the manifold 209, and between the manifold 209 and the seal cap 219. The processing container is configured mainly by the reaction tube 203, the manifold 209, and the seal cap 219. A processing chamber 201 is formed in the processing container. The processing chamber 201 is configured to be able to accommodate wafers 200 as substrates vertically aligned in multiple stages in horizontal positions by a boat 217 described later.

A rotating mechanism 267 for rotating the boat 217 is provided on the side of the seal cap 219 opposite to the processing chamber 201. A rotating shaft 255 of the rotating mechanism 267 is extended through the seal cap 219 to be connected to the boat 217. The rotating mechanism 267 is configured to rotate the boat 217, thereby to rotate the wafers 200. A boat elevator 115 is configured to raise and lower the seal cap 219 so that the boat 217 can be carried into and out of the processing chamber 201. That is, the boat elevator 115 is configured as a transferring device (transferring mechanism) for transferring the boat 217 or the wafers 200 into and out of the processing chamber 201.

The boat 217 as a substrate retainer is configured to support a plurality of, for example, 25 to 200 wafers 200 in horizontal positions and in a state of being aligned at the center with each other in a vertical line in multiple stages, that is, to space them in a line. The boat 217 is made from a heat resistant material or the like (e.g., quartz or SiC). At the bottom of the boat 217, heat insulating plates 218 made from a heat resistant material or the like (e.g., quartz or SiC) are supported in horizontal positions in multiple stages. This configuration causes heat from the heater 207 to be less transmitted to the seal cap 219 side. However, this embodiment is not limited to the above-described form. For example, instead of providing the heat insulating plates 218 at the bottom of the boat 217, a heat insulating tube configured as a tubular member made from a heat resistant material such as quartz or SiC may be provided. The heater 207 can heat the wafers 200 accommodated in the processing chamber 201 to a predetermined temperature.

In the processing chamber 201, nozzles 410, 420, and 430 are provided to extend through a side wall of the manifold 209. Gas supply pipes 310, 320, and 330 as gas supply lines are connected to the nozzles 410, 420, and 430, respectively. Thus, the three nozzles 410, 420, and 430 and the three gas supply pipes 310, 320, and 330 are provided to the reaction tube 203, and are configured to be able to supply two or more types, here three types of gases (processing gases or sources) into the processing chamber 201 via respective dedicated lines.

To the gas supply pipes 310, 320, and 330, mass flow controllers (MFCs) 312, 322, and 332, which are flow rate controllers (flow rate control units), and valves 314, 324, and 334, which are opening/closing valves, are provided in order from an upstream side. The nozzles 410, 420, and 430 are coupled and connected to distal end portions of the gas supply pipes 310, 320, and 330. The nozzles 410, 420, and 430 are configured as L-shaped long nozzles, and have horizontal portions provided to extend through the side wall of the manifold 209. Vertical portions of the nozzles 410, 420, and 430 are provided in an annular space formed between an inner wall of the reaction tube 203 and the wafers 200 to rise upward along the inner wall of the reaction tube 203 (upward in the stacking direction of the wafers 200) (that is, to rise from one end to the other end of a wafer alignment region). In other words, the nozzles 410, 420, and 430 are provided in a region horizontally surrounding the wafer alignment region in which the wafers 200 are aligned, at the side of the wear alignment region, along the wafer alignment region.

The nozzles 410, 420, and 430 are provided, in side surfaces, with a plurality of gas supply holes 410a, 420a, and 430a, respectively, through which to supply (eject) gas. The gas supply holes 410a, 420a, and 430a are opened to face the center of the reaction tube 203. The gas supply holes 410a, 420a, and 430a are provided along the reaction tube 203 from the bottom to the top thereof, have the same opening area, and are provided at the same opening pitch.

Thus, in a gas supply method in this embodiment, gas is conveyed through the nozzles 410, 420, and 430 disposed in an annular vertically long space defined by the inner wall of the reaction tube 203 and the edges of the stacked wafers 200, that is, in a cylindrical space, and the gas is ejected from the gas supply holes 410a, 420a, and 430a opened in the nozzles 410, 420, and 430, respectively, into the reaction tube 203 first in the vicinity of the wafers 200, so that the main flow of the gas in the reaction tube 203 is in a direction parallel to the surface of the wafers 200, that is, in a horizontal direction. This configuration allows gas to be supplied uniformly to the wafers 200, and has an effect of being able to make thin films formed on the wafers 200 uniform in thickness. Gas flowing over the surface of the wafers 200, that is, gas remaining after reaction (a gas residue) flows toward an exhaust opening, that is, an exhaust pipe 231 described later. The flow direction of the gas residue is not limited to a vertical direction, and is appropriately determined by the positon of an exhaust opening.

Carrier gas supply pipes 510, 520, and 530 for supplying a carrier gas are connected to the gas supply pipes 310, 320, and 330. The carrier gas supply pipes 510, 520, and 530 are provided with MFCs 512, 522, 532 and valves 514, 524, and 534.

As an example in the above configuration, from the gas supply pipe 310, a first source gas containing a metal element (first metal-containing gas) is supplied as a processing gas through the MFC 312, the valve 314, and the nozzle 410 into the processing chamber 201. As the first source, for example, a metal source containing titanium (Ti) as a metal element and not containing carbon (C), specifically, titanium tetrachloride ($TiCl_4$) as a halogen-based source (also referred to as a halide or a halogen-based titanium source), an inorganic metal-based source (inorganic metal compound), is used. Ti is classified as a transition metal element. A halogen-based source is a source containing a halogen group. The halogen group includes a chloro group, a fluoro group, a bromo group, an iodine group, and the like. That is, a halogen group contains a halogen element such as chloride (Cl), fluorine (F), bromine (Br), iodine (I), or the like.

From the gas supply pipe 320, a second source gas containing a metal element (second metal-containing gas) is supplied as a processing gas through the MFC 322, the valve 324, and the nozzle 420 into the processing chamber 201. As the second source, for example, a metal source containing Ti as a metal element and containing C (C-containing), specifically, tetrakis(diethylamino)titanium (TDEAT, $Ti[(C_2Hd_2N]_4$) as an organic source (organic metal compound or organic titanium source) is used.

From the gas supply pipe 330, an N-containing gas as a reaction gas containing nitrogen (N) is supplied as a processing gas through the MFC 332, the valve 334, and the nozzle 430 into the processing chamber 201. As an N-containing gas, an N-containing gas not containing a metal element, for example, an ammonia ($NH_3$) gas can be used.

From the carrier gas supply pipes 510, 520, and 530, a nitrogen ($N_2$) gas, for example, is supplied as an inert gas through the MFCs 512, 522, and 532 and the valves 514, 524, and 534, and the nozzles 410, 420, and 430 into the processing chamber 201, respectively.

Herein, a source gas is a source in a gaseous state, for example, a gas obtained by vaporing or sublimating a source that is in a liquid state or a solid state under room temperature and atmospheric pressure, a source in a gaseous state under room temperature and atmospheric pressure, or the like. When the word "source" is used herein, it may mean a "liquid source in a liquid state," a "solid source in a solid state," a "source gas in a gaseous state", or a combination of them. When a liquid source that is in a liquid state under room temperature and atmospheric pressure such as $TiCl_4$, or a solid source that is in a solid state under room temperature and atmospheric pressure such as $AlCl_3$ is used, the liquid source or the solid source is vaporized or sublimated by a system such as a vaporizer, bubbler, or a sublimation apparatus to be supplied as a source gas (such as a $TiCl_4$ gas or an $AlCl_3$ gas).

When processing gases as described above are passed from the gas supply pipes 310, 320, and 330, a processing gas supply system is configured mainly by the gas supply pipes 310, 320, and 330, the MFCs 312, 322, and 332, and the valves 314, 324, and 334. The nozzles 410, 420, and 430 may be included in the processing gas supply system. The processing gas supply system may be referred to simply as a gas supply system.

When metal-containing gases as source gases as described above are passed from the gas supply pipes 310 and 320, a metal-containing gas supply system as a source gas supply system is configured mainly by the gas supply pipes 310 and 320, the MFCs 312 and 322, and the valves 314 and 324. The nozzles 410 and 420 may be included in the source gas supply system. The source gas supply system may be referred to simply as a source supply system.

When a halogen-based source gas is passed as a source gas from the gas supply pipe 310, a halogen-based source gas supply system is configured mainly by the gas supply pipe 310, the MFC 312, and the valve 314. The nozzle 410 may be included in the halogen-based source gas supply system. The halogen-based source gas supply system may be referred to as a halogen-based source supply system. When a $TiCl_4$ gas is passed from the gas supply pipe 310, the halogen-based source gas supply system may be referred to as a $TiCl_4$ gas supply system. The $TiCl_4$ gas supply system may be referred to as a $TiCl_4$ supply system.

When an organic source gas is passed as a source gas from the gas supply pipe 320, an organic source gas supply system is configured mainly by the gas supply pipe 320, the MFC 322, and the valve 324. The nozzle 420 may be included in the organic source gas supply system. The organic source gas supply system may be referred to as an organic source supply system. When a TDEAT gas is passed from the gas supply pipe 320, the organic source gas supply system may be referred to as a TDEAT gas supply system. The TDEAT gas supply system may be referred to as a TDEAT supply system.

When an N-containing gas is passed as a reaction gas from the gas supply pipe 330, an N-containing gas supply system is configured mainly by the gas supply pipe 330, the MFC 332, and the valve 334. The nozzle 430 may be included in the N-containing gas supply system. When an $NH_3$ gas is passed from the gas supply pipe 330, the reaction gas supply system may be referred to as an $NH_3$ gas supply system. The reaction gas supply system may be referred to as an $NH_3$ supply system.

A carrier gas supply system is configured mainly by the carrier gas supply pipes 510, 520, and 530, the MFCs 512, 522, and 532, and the valves 514, 524, and 534. When an inert gas is passed as a carrier gas, the carrier gas supply system may be referred to as an inert gas supply system. Since the inert gas also functions as a purge gas, the inert gas supply system may be referred to as a purge gas supply system.

The manifold 209 is provided with the exhaust pipe 231 for exhausting an atmosphere in the processing chamber 201. The exhaust pipe 231 is provided to extend through a side wall of the manifold 209 like the nozzles 410, 420, and 430. As shown in FIG. 2, the exhaust pipe 231, in a plan view, is provided in a position facing the nozzles 410, 420, and 430 across the wafers 200. This configuration causes gas supplied from the gas supply holes 410a, 420a, and 430a to the vicinity of the wafers 200 in the processing chamber 201 to flow in a horizontal direction, that is, in a direction parallel to the surface of the wafers 200, and then flow downward to be exhausted from the exhaust pipe 231. The main flow of gas in the processing chamber 201 becomes a flow in a horizontal direction as described above.

To the exhaust pipe 231, a pressure sensor 245 as a pressure detector (pressure detection unit) for detecting a pressure in the processing chamber 201, an auto pressure controller (APC) valve 243, and a vacuum pump 246 as a vacuum-exhaust device are connected in order from an upstream side. The APC valve 243 is an exhaust valve, and functions as a pressure regulator. To the exhaust pipe 231, a trap device for trapping a reaction by-product, an unreacted source gas, and the like in exhaust gas, or a detoxifying device for detoxifying a corrosive component, a noxious component, and the like contained in exhaust gas may be connected. An exhaust system, or an exhaust line, is configured mainly by the exhaust pipe 231, the APC valve 243, and the pressure sensor 245. The vacuum pump 246 may be included in the exhaust system. Further, the trap device or the detoxifying device may be included in the exhaust system.

The APC valve 243 is configured to be able to perform vacuum-exhausting and stop vacuum-exhausting gas in the processing chamber 201 by opening and closing a valve with the vacuum pump 246 operated, and further to be able to regulate the pressure in the processing chamber 201 by adjusting the degree of valve opening with the vacuum pump 246 operated. The APC valve 243 constitutes a part of an exhaust flow path in the exhaust system, and not only functions as a pressure regulator but also functions as an exhaust flow path opening/closing unit capable of blocking the exhaust flow path in the exhaust system and further hermetically sealing it, that is, an exhaust valve. In other words, the exhaust system is configured to be able to make an "actual pressure" in the processing chamber 201 closer to a predetermined "set pressure" by adjusting the degree of opening of the valve of the APC valve 243 based on pressure information detected by the pressure sensor 245 while operating the vacuum pump 246. For example, when the flow rate of gas supplied into the processing chamber 201 is not changed, or when gas supply into the processing chamber 201 is stopped, to change the actual pressure in the processing chamber 201, the set pressure in the processing chamber 201 is changed, and the degree of opening of the valve of the APC valve 243 is changed to a degree of opening according to the set pressure. As a result, the exhaust capacity of the exhaust line is changed, and the actual pressure in the processing chamber 201 becomes gradually (in a curved manner) closer to the set pressure. Thus, the "set pressure" in the processing chamber 201 can be synonymous with a "target pressure" in performing pressure control in the processing chamber 201, and the "actual pressure" in the processing chamber 201 follows the value. "Changing the set pressure in the processing chamber 201" is substantially synonymous with "changing the degree of opening of the APC valve 243 to change the exhaust capacity of the exhaust line," and can be considered as a "command to change the degree of opening of the APC valve 243."

A temperature sensor 263 as a temperature detector is installed in the reaction tube 203. By regulating the amount of current passed through the heater 207 based on temperature information detected by the temperature sensor 263, the temperature in the processing chamber 201 has a desired temperature distribution. The temperature sensor 263 is configured in an L shape like the nozzles 410, 420, and 430, and is provided along the inner wall of the reaction tube 203.

Figure 3:
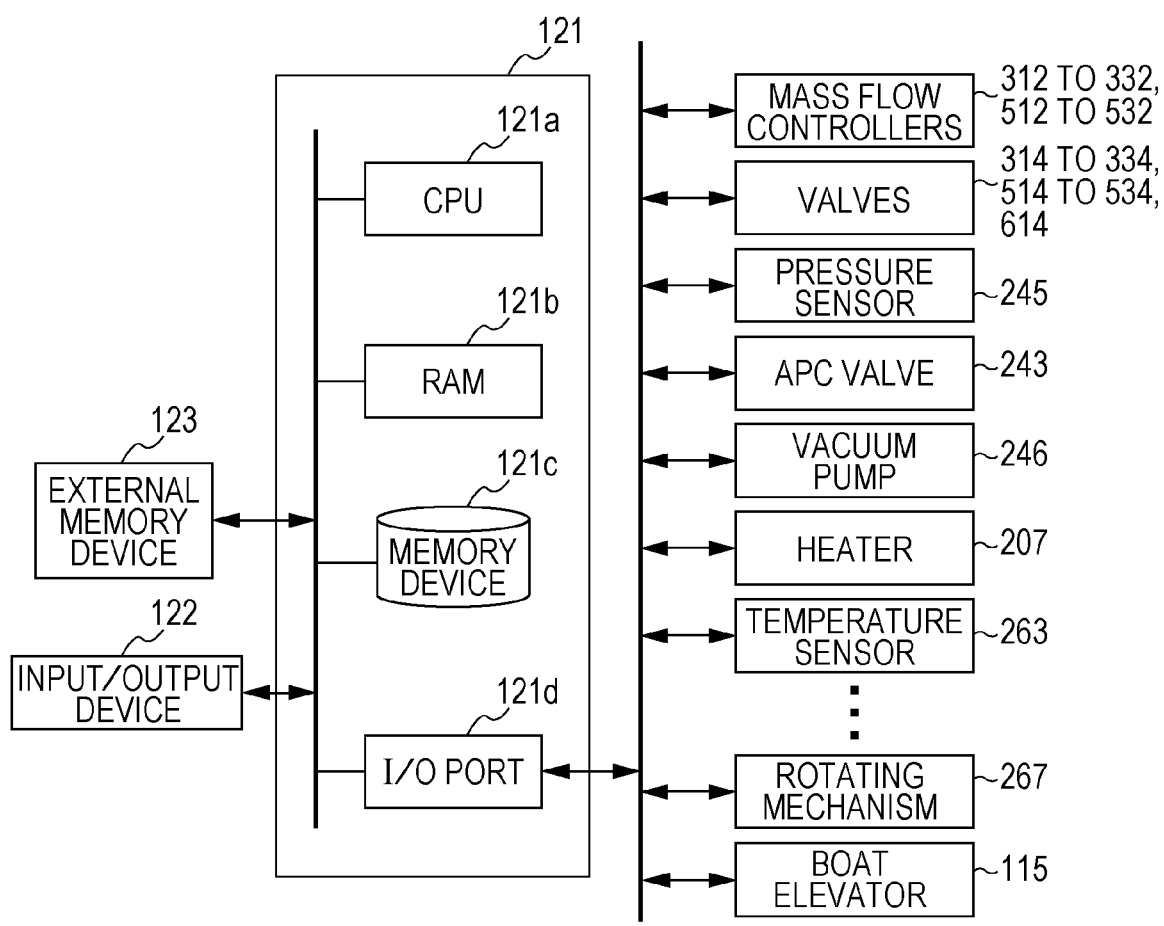
FIG. 3 is a block diagram illustrating a configuration of a controller included in the substrate processing apparatus shown in FIG. 1.

As shown in FIG. 3, a controller 121 as a control unit (control means) is configured as a computer having a central processing unit (CPU) 121a, a random-access memory (RAM) 121b, a memory device 121c, and an I/O port 121d.

The RAM 121b, the memory device 121c, and the I/O port 121d are configured to be able to exchange data with the CPU 121a via an internal bus. An input/output device 122 configured as a touch panel or the like, for example, is connected to the controller 121.

The memory device 121c is configured by, for example, a flash memory, a hard disk drive (HDD), or the like. In the memory device 121c, a control program to control an operation of the substrate processing apparatus, a process recipe in which a substrate processing process and conditions described later, or the like is written, and the like are readably stored. The process recipe is assembled to cause the controller 121 to execute steps in a substrate processing process described later to obtain a predetermined result, and functions as a program. Hereinafter, the process recipe, the control program, and the like are also generically referred to simply as a program. When the word "program" is used herein, it may include a process recipe alone, or may include a control program alone, or may include both of them. The RAM 121b is configured as a memory area (work area) in which a program, data, or the like read by the CPU 121a is temporarily held.

The I/O port 121d is connected to the MFCs 312, 322, 332, 512, 522, and 532, the valves 314, 324, 334, 514, 524, and 534, the APC valve 243, the pressure sensor 245, the vacuum pump 246, the heater 207, the temperature sensor 263, the rotating mechanism 267, the boat elevator 115, and others.

The CPU 121a is configured to read the control program from the memory device 121c and execute it, and to read the process recipe from the memory device 121c in response to an input of an operation command from the input/output device 122 or the like. The CPU 121a is configured to control, according to the read process recipe, flow rate regulating operations for various gases by the MFCs 312, 322, 332, 512, 522, and 532, opening/closing operations of the valves 314, 324, 334, 514, 524, and 534, an opening/closing operation of the APC valve 243 and a pressure regulating operation based on the pressure sensor 245 by the APC valve 243, a temperature regulating operation of the heater 207 based on the temperature sensor 263, starting and stopping of the vacuum pump 246, rotation and rotation speed control operations for the boat 217 by the rotating mechanism 267, an raising/lowering operation for the boat 217 by the boat elevator 115, and the like.

The controller 121 is not limited to one configured as a dedicated computer, and may be configured as a general-purpose computer. For example, the controller 121 according to this embodiment can be configured by preparing an external memory device (such as a magnetic tape, a magnetic disk such as a flexible disk or a hard disk, an optical disk such as a CD or a DVD, an optical magnetic disk such as an MO, or a semiconductor memory such as a USB memory or a memory card) 123 in which the above-described program is stored, and installing the program in a general-purpose computer using the external memory device 123. However, a means to supply a program to a computer is not limited to the case of supplying it via the external memory device 123. For example, a program may be supplied using a communication means such as the Internet or a dedicated line without the external memory device 123. The memory device 121c or the external memory device 123 is configured as a non-transitory computer-readable recording medium. Hereinafter, these are also generically referred to simply as a recording medium. When the word "non-transitory computer-readable recording medium" is used herein, it may include the memory device 121c alone, or may include the external memory device 123 alone, or may include both of them.

(2) Substrate Processing Process (Film-Forming Process)

Figure 4:
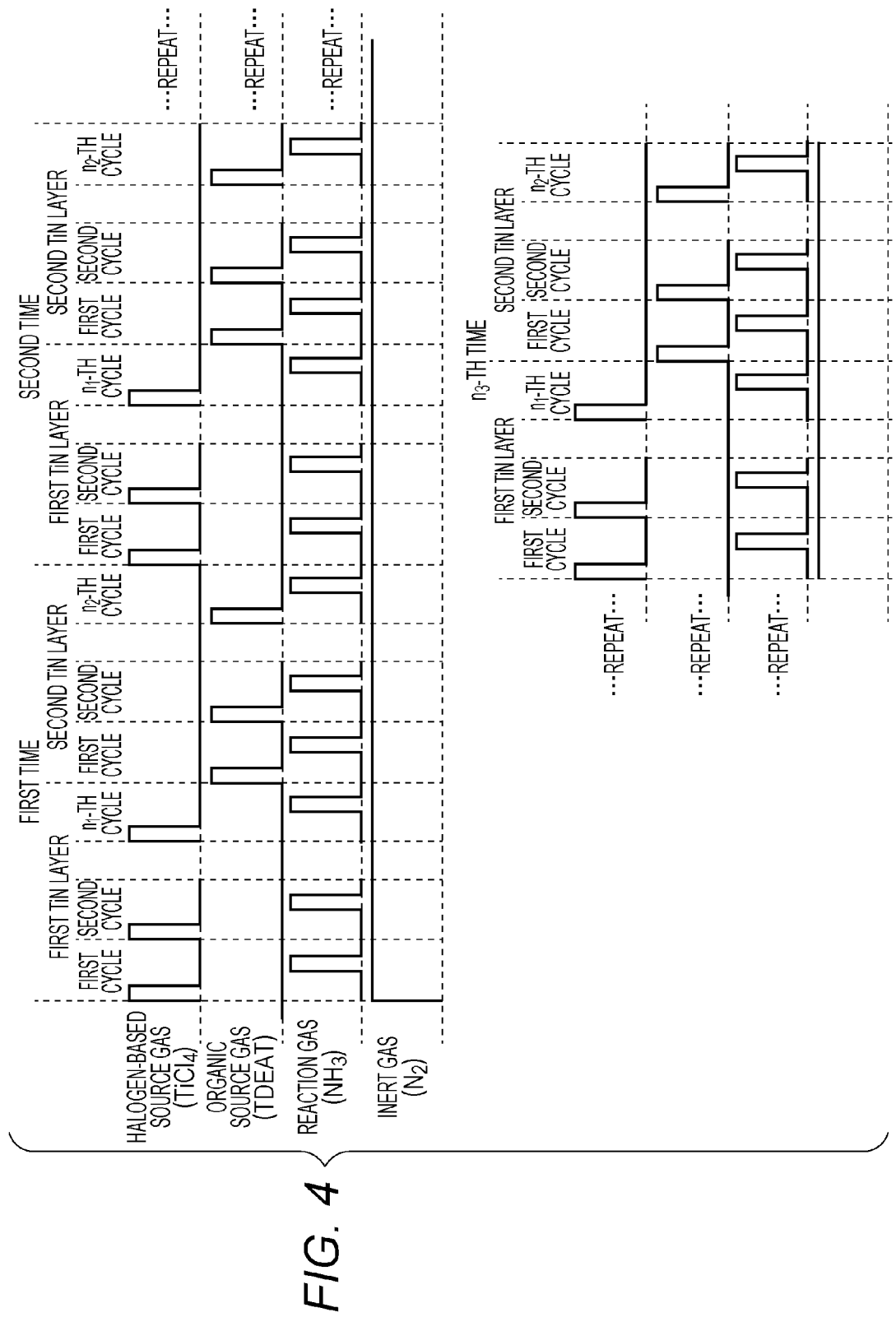
FIG. 4 is a diagram illustrating a sequence in a first embodiment of the present invention.

As a step in a process of manufacturing semiconductor device, an example of a process of forming a metal film constituting a gate electrode, for example, on a substrate will be described with reference to FIG. 4. The process of forming a metal film is performed using the above-described processing furnace 202 of the substrate processing apparatus 10. In the following description, operations of the components constituting the substrate processing apparatus 10 are controlled by the controller 121.

First Embodiment of the Present Invention

A preferable film-forming sequence (also referred to simply as a sequence) in this embodiment includes the steps of: (a) supplying a halogen-based source gas (e.g., a $TiCl_4$ gas) containing a metal element (e.g., Ti), a first element, to the wafers 200; (b) supplying a reaction gas (e.g., an $NH_3$ gas) containing a second element (e.g., nitrogen (N)) to react with the first element to the wafers 200; (c) forming a first layer (e.g., a TiN layer) containing the first element and the second element on the wafers 200 by time-dividing and performing (a) and (b) a predetermined number of times (by temporary separated pulses of (a) and (b)); (d) supplying an organic source gas (e.g., a TDEAT gas) containing the first element to the wafers 200; (e) supplying the reaction gas to the wafers 200; (f) forming a second layer containing the first element and the second element on the wafers 200 by time-dividing and performing (d) and (e) a predetermined number of times (by temporary separated pulses of (d) and (e)); and (g) forming a thin film containing the first element and the second element on the substrate by time-dividing and performing (c) and (f) a predetermined number of times.

When the word "wafer" is used herein, it may mean a "wafer itself," or may mean a "laminated body (aggregate) of a wafer and a given layer, film, or the like formed on its surface" (that is, it refers to a wafer including a given layer, film, or the like formed on the surface). When the words "wafer surface" are used herein, they may mean a "surface (exposed surface) of a wafer itself," or may mean a "surface of a given layer, film, or the like formed on a wafer, that is, an outermost surface of a wafer as a laminated body."

Therefore, when the description "a given gas is supplied to a wafer" is made herein, it may mean that "a given gas is directly supplied to a surface (exposed surface) of a wafer itself," or may mean that "a given gas is supplied to a layer, film, or the like formed on a wafer, that is, to an outermost surface of a wafer as a laminated body." When the description "a given layer (or film) is formed on a wafer" is made in this description, it may mean that "a given layer (or film) is directly formed on a surface (exposed surface) of a wafer itself," or may mean that "a given layer (or film) is formed on a layer, a film, or the like formed on a wafer, that is, on an outermost surface of a wafer as a laminated body."

When the word "substrate" is used herein, it is the same as when the word "wafer" is used. In that case, the word "wafer" can be replaced with the word "substrate" in the above explanation for consideration.

The word metal film herein means a film made of a conductive material containing metal atoms. This includes a conductive metal nitride film, a conductive metal oxide film, a conductive metal oxynitride film, a conductive metal composite film, a conducive metal alloy film, a conductive metal silicide film, a conductive metal carbide film, a conductive metal carbonitride film, and the like. A titanium aluminum carbide film (TiAlC film) is a conductive metal carbonitride film.

Wafer Charge and Boat Load

Figure 2:
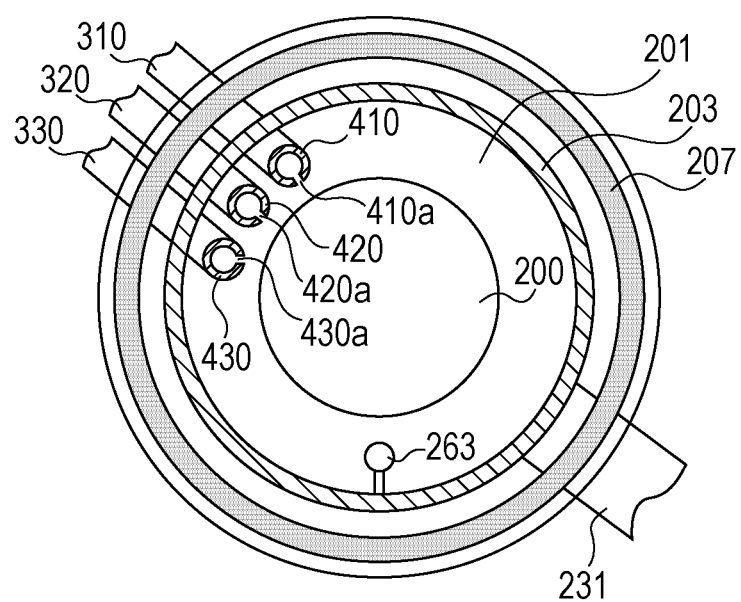
FIG. 2 is a cross-sectional view along line A-A in FIG. 1.

When the plurality of wafers 200 is loaded into the boat 217 (wafer charge), the boat 217 supporting the plurality of wafers 200 is lifted by the boat elevator 115 to be loaded into the processing chamber 201 (boat load) as shown in FIG. 1. In this state, the seal cap 219 is in a state of closing the bottom opening of the reaction tube 203 via the O-ring 220.

Pressure Regulation and Temperature Regulation

The inside of the processing chamber 201 is vacuum-exhausted by the vacuum pump 246 to have a desired pressure (degree of vacuum). At this time, the pressure in the processing chamber 201 is measured by the pressure sensor 245, and based on the measured pressure information, the APC valve 243 is feedback-controlled (pressure regulation). The vacuum pump 246 maintains a state of being continuously operated at least until processing on the wafers 200 has been completed. The processing chamber 201 is heated by the heater 207 to have a desired temperature inside. At this time, the amount of current passed through the heater 207 is feedback-controlled based on temperature information detected by the temperature sensor 263 so that a desired temperature distribution is provided in the processing chamber 201 (temperature regulation). Heating the inside of the processing chamber 201 by the heater 207 is performed continuously at least until processing on the wafers 200 has been completed. Subsequently, rotation of the boat 217 and the wafers 200 is started by the rotating mechanism 267. The rotation of the boat 217 and the wafers 200 by the rotating mechanism 267 is performed continuously at least until processing on the wafers 200 has been completed.

First TiN Film-Forming Step

Subsequently, a step of forming a first TiN film is performed. The first TiN film-forming step includes a halogen-based source gas supply step, a residual gas removal step, an N-containing gas supply step, and a residual gas removal step described later.

Halogen-Based Source Gas Supply Step

The valve 314 is opened to pass a $TiCl_4$ gas, a halogen-based source, into the gas supply pipe 310. The $TiCl_4$ gas passed through the gas supply pipe 310 is regulated in flow rate by the MFC 312. The $TiCl_4$ gas regulated in flow rate is supplied from the gas supply holes 410a of the nozzle 410 into the processing chamber 201, and exhausted from the exhaust pipe 231. At this time, the $TiCl_4$ gas is supplied to the wafers 200. That is, the surface of the wafers 200 is exposed to the $TiCl_4$ gas. At the same time, the valve 514 is opened to pass an inert gas such as an $N_2$ gas into the carrier gas supply pipe 510. The $N_2$ gas passed through the carrier gas supply pipe 510 is regulated in flow rate by the MFC 512. The $N_2$ gas regulated in flow rate is supplied into the processing chamber 201 together with the $TiCl_4$ gas, and exhausted from the exhaust pipe 231. At this time, to prevent entry of the $TiCl_4$ gas into the nozzles 420 and 430, the valves 524 and 534 are opened to pass an $N_2$ gas into the carrier gas supply pipes 520 and 530. The $N_2$ gas is supplied through the gas supply pipes 320 and 330 and the nozzles 420 and 430 into the processing chamber 201, and exhausted from the exhaust pipe 231.

At this time, the APC valve 243 is regulated properly to make the pressure in the processing chamber 201 a pressure in a range of 1 to 10000 Pa, for example. The supply flow rate of the $TiCl_4$ gas controlled by the MFC 312 is a flow rate in a range of 10 to 10000 sccm, for example. The supply flow rates of the $N_2$ gas controlled by the MFCs 512, 522, and 532 are individually a flow rate in a range of 10 to 10000 sccm, for example. Time for which the $TiCl_4$ gas is supplied to the wafers 200, that is, gas supply time (irradiation time) is a time in a range of 0.1 to 120 seconds, for example. At this time, the temperature of the heater 207 is set to a temperature that causes the temperature of the wafers 200 to become a temperature in a range of 200 to 500° C., for example. The gas passed through the processing chamber 201 includes only the $TiCl_4$ gas and the $N_2$ gas. By supplying the $TiCl_4$ gas, a Ti-containing layer with a thickness of less than one atomic layer to several atomic layers, for example, is formed on the wafers 200 (a base film of the surface).

The Ti-containing layer rarely becomes a Ti layer containing only Ti single atoms, and in fact, often contains other atoms derived from the sources. Thus, it often includes Cl, a halogen-based element, in a halogen-based source gas supply step. In other words, the Ti-containing layer can be said to be almost a $TiCl_4$ layer, a $TiCl_4$ adsorption layer. The $TiCl_4$ layer includes a continuous adsorption layer of $TiCl_4$ molecules, as well as a discontinuous adsorption layer. Specifically, the $TiCl_4$ layer includes an adsorption layer with a thickness of one molecular layer or less than one molecular layer formed by $TiCl_4$ molecules. $TiCl_4$ molecules constituting the $TiCl_4$ layer include those in which bonds between Ti and Cl are partly broken. That is, the $TiCl_4$ layer includes a physical adsorption layer and a chemical adsorption layer of $TiCl_4$. However, under the above-described processing conditions, chemical adsorption of $TiCl_4$ onto the wafers 200 is superior to physical adsorption.

Here, a layer with a thickness of less than one atomic layer means an atomic layer formed discontinuously, and a layer with a thickness of one atomic layer means an atomic layer formed continuously. A layer with a thickness of less than one molecular layer means a molecular layer formed discontinuously, and a layer with a thickness of one molecular layer means a molecular layer formed continuously. This applies to an example described later as well.

Residual Gas Removal Step

After the Ti-containing film is formed, the valve 314 is closed to stop the supply of the $TiCl_4$ gas. At this time, the APC valve 243 of the exhaust pipe 231 is left opened to vacuum-exhaust the inside of the processing chamber 201 by the vacuum pump 246 to remove unreacted $TiCl_4$ gas or $TiCl_4$ gas after contributing to the formation of the Ti-containing film remaining in the processing chamber 201 from inside the processing chamber 201. That is, unreacted $TiCl_4$ gas or $TiCl_4$ gas after contributing to the formation of the Ti-containing layer remaining in a space where the wafers 200 on which the Ti-containing layer is formed are present is removed. At this time, the valves 514, 524, and 534 are left opened to keep the supply of the $N_2$ gas into the processing chamber 201. The $N_2$ gas functions as a purge gas to increase the effect of removing unreacted $TiCl_4$ gas or $TiCl_4$ gas after contributing to the formation of the Ti-containing film remaining in the processing chamber 201 from inside the processing chamber 201.

At this time, the gas remaining in the processing chamber 201 does not need to be completely removed, and the inside of the processing chamber 201 does not need to be completely purged. When the amount of the gas remaining in the processing chamber 201 is minute, it does not cause an adverse effect in a step performed thereafter. The flow rate of the $N_2$ gas supplied into the processing chamber 201 does not need to be a high flow rate. For example, by supplying the same amount as the volume of the reaction tube 203 (processing chamber 201), a purge enough not to cause an adverse effect in a subsequent step can be performed. By not completely purging the inside of the processing chamber 201 like this, purge time can be reduced to increase throughput. Further, the consumption of the $N_2$ gas can be reduced to a minimum.

N-Containing Gas Supply Step

After the residual gas in the processing chamber 201 is removed, the valve 334 is opened to pass an $NH_3$ gas, an N-containing gas, into the gas supply pipe 330. The $NH_3$ gas passed through the gas supply pipe 330 is regulated in flow rate by the MFC 332. The $NH_3$ gas regulated in flow rate is supplied from the gas supply holes 430a of the nozzle 430 into the processing chamber 201. The $NH_3$ gas supplied into the processing chamber 201 is activated by heat, and then exhausted from the exhaust pipe 231. At this time, the heat-activated $NH_3$ gas is supplied to the wafers 200. That is, the surface of the wafers 200 is exposed to the heat-activated $NH_3$ gas. At the same time, the valve 534 is opened to pass the $N_2$ gas into the carrier gas supply pipe 530. The $N_2$ gas passed through the carrier gas supply pipe 530 is regulated in flow rate by the MFC 532. The $N_2$ gas is supplied into the processing chamber 201 together with the $NH_3$ gas, and exhausted from the exhaust pipe 231. At this time, to prevent entry of the $NH_3$ gas into the nozzles 410 and 420, the valves 514 and 524 are opened to pass the $N_2$ gas into the carrier gas supply pipes 510 and 520. The $N_2$ gas is supplied through the gas supply pipes 310 and 320 and the nozzles 410 and 420 into the processing chamber 201, and exhausted from the exhaust pipe 231.

When the $NH_3$ gas is passed, the APC valve 243 is properly regulated to make the pressure in the processing chamber 201 a pressure in a range of 1 to 10000 Pa, for example. The supply flow rate of the $NH_3$ gas controlled by the MFC 332 is a flow rate in a range of 10 to 50000 sccm, for example. The supply flow rates of the $N_2$ gas controlled by the MFCs 512, 522, and 532 are individually a flow rate in a range of 10 to 10000 sccm, for example. Time for which the heat-activated $NH_3$ gas is supplied to the wafers 200, that is, gas supply time (irradiation time) is a time in a range of 0.1 to 120 seconds, for example. The temperature of the heater 207 at this time is set to a temperature that causes the temperature of the wafers 200 to become a temperature in a range of 200 to 500° C., for example, as in step 11.

The gas passed through the processing chamber 201 at this time includes only the $NH_3$ gas and the $N_2$ gas. The $NH_3$ gas substitutes for at least a portion of the Ti-containing layer formed on the wafers 200 in the halogen-based source gas supply step. During substitution, Ti contained in the Ti-containing layer and N contained in the $NH_3$ gas bond together to form a TiN layer containing Ti and N on the wafers 200.

Residual Gas Removal Step

After the TiN layer is formed, the valve 334 is closed to stop the supply of the $NH_3$ gas. At this time, the APC valve 243 of the exhaust pipe 231 is left opened to vacuum-exhaust the inside of the processing chamber 201 by the vacuum pump 246 to remove unreacted $NH_3$ gas or $NH_3$ gas after contributing to the formation of the TiN layer remaining in the processing chamber 201, and reaction by-products from inside the processing chamber 201. At this time, the valves 514, 524, and 534 are left opened to keep the supply of the $N_2$ gas into the processing chamber 201. The $N_2$ gas functions as a purge gas to increase the effect of removing unreacted $NH_3$ gas or $NH_3$ gas after contributing to the formation of the TiN layer remaining in the processing chamber 201, and reaction by-products from inside the processing chamber 201.

At this time, the gas remaining in the processing chamber 201 does not need to be completely removed, and the inside of the processing chamber 201 does not need to be completely purged, as in the residual gas removal step after the halogen-based source gas supply step.

Performing Predetermined Number of Times

By performing, once or more (a predetermined number of times), a cycle in which the above-described halogen-based source gas supply step, residual gas removal step, N-containing gas supply step, and residual gas removal step are time-divided and performed in order, that is, with processing of the halogen-based source gas supply step, residual gas removal step, N-containing gas supply step, and residual gas removal step as one cycle, by performing these steps by $n_1$ cycles ($n_1$ is an integer not less than one), a TiN film (first TiN film) with a predetermined thickness (e.g., 0.1 to 10 nm) is formed on the wafers 200. The above-described cycle is preferably repeated more than once.

When the cycle is performed more than once, the description "gas is supplied to the wafers 200" in each step in at least the second and subsequent cycles means that "a predetermined gas is supplied to a layer formed on the wafers 200, that is, to an outermost surface of the wafers 200 as a laminated body." The description "a predetermined layer is formed on the wafers 200" means that "a predetermined layer is formed on a layer formed on the wafers 200, that is, on an outermost surface of the wafers 200 as a laminated body." This applies to an example described later as well.

Second TiN Film-Forming Step

Subsequently, a step of forming a second TiN film is performed. The second TiN film-forming step includes an organic source gas supply step, a residual gas removal step, an N-containing gas supply step, and a residual gas removal step described below.

Organic Source Gas Supply Step

The valve 324 is opened to pass a TDEAT gas, an organic source gas, into the gas supply pipe 320. The TDEAT gas passed through the gas supply pipe 320 is regulated in flow rate by the MFC 322. The TDEAT gas regulated in flow rate is supplied from the gas supply holes 420a of the nozzle 420 into the processing chamber 201, and exhausted from the exhaust pipe 231. At this time, the TDEAT gas is supplied to the wafers 200. That is, the surface of the wafers 200 is exposed to the TDEAT gas. At the same time, the valve 524 is opened to pass the $N_2$ gas into the carrier gas supply pipe 520. The $N_2$ gas passed through the carrier gas supply pipe 520 is regulated in flow rate by the MFC 522. The $N_2$ gas regulated in flow rate is supplied into the processing chamber 201 together with the TDEAT gas, and exhausted from the exhaust pipe 231. At this time, to prevent entry of the TDEAT gas into the nozzles 410 and 430, the valves 514 and 534 are opened to pass the $N_2$ gas into the carrier gas supply pipes 510 and 530.

The N$_2$ gas is supplied through the gas supply pipes 310 and 330 and the nozzles 410 and 430 into the processing chamber 201, and exhausted from the exhaust pipe 231.

At this time, the APC valve 243 is regulated properly to make the pressure in the processing chamber 201 a pressure in a range of 1 to 10000 Pa, for example, as in step 11. The supply flow rate of the TDEAT gas controlled by the MFC 322 is a flow rate in a range of 10 to 10000 sccm, for example. The supply flow rates of the N$_2$ gas controlled by the MFCs 512, 522, and 532 are individually a flow rate in a range of 10 to 10000 sccm, for example. Time for which the TDEAT gas is supplied to the wafers 200, that is, gas supply time (irradiation time) is a time in a range of 0.1 to 120 seconds, for example. The temperature of the heater 207 at this time is set to a temperature as in the halogen-based source gas supply step. The gas passed through the processing chamber 201 includes only the TDEAT gas and the N$_2$ gas. By supplying the TDEAT gas, a Ti-containing layer with a thickness of less than one atomic layer to several atomic layers, for example, is formed on the wafers 200 (a base film of the surface, here the first TiN film).

Like the Ti-containing layer formed in the halogen-based source gas supply step, the Ti-containing layer formed in the organic source forming step rarely becomes a Ti layer containing only Ti single atoms, and in fact, often contains other atoms derived from the sources. Thus, organic substances such as C and N and amine are often included in the organic source gas supply step using the TDEAT gas. Thus, the Ti-containing layer can be said to be a TDEAT layer, a TDEAT adsorption layer. The TDEAT layer includes a continuous adsorption layer of TDEAT molecules, as well as a discontinuous adsorption layer. Specifically, the TDEAT layer includes an adsorption layer with a thickness of one molecular layer or less than one molecular layer made of TDEAT molecules. TDEAT molecules constituting the TDEAT layer include those in which bonds between Ti and C, N, and H are partly broken. That is, the TDEAT layer includes a physical adsorption layer and a chemical adsorption layer of TDEAT. However, under the above-described processing conditions, chemical adsorption of TDEAT onto the wafers 200 is superior to physical adsorption.

Residual Gas Removal Step

Thereafter, the valve 324 is closed to stop the supply of the TDEAT gas. At this time, the APC valve 243 of the exhaust pipe 231 is left opened to vacuum-exhaust the inside of the processing chamber 201 by the vacuum pump 246 to remove unreacted TDEAT gas or TDEAT gas after contributing to the formation of the above-described Ti-containing layer remaining in the processing chamber 201 from inside the processing chamber 201. At this time, the valves 510, 520, and 530 are left opened to keep the supply of the N$_2$ gas into the processing chamber 201. The N$_2$ gas functions as a purge gas, thereby to increase the effect of removing unreacted TDEAT gas or TDEAT gas after contributing to the formation of the above-described Ti-containing layer remaining in the processing chamber 201 from inside the processing chamber 201.

At this time, as in the residual gas removal step after the halogen-based source gas supply step, the gas remaining in the processing chamber 201 does not need to be completely removed, and the inside of the processing chamber 201 does not need to be completely purged.

N-Containing Gas Supply Step

Next, by the same processing process and under the same processing conditions as the above-described N-containing gas supply step, an NH$_3$ gas is supplied into the processing chamber 201 as an N-containing gas. The gas passed through the processing chamber 201 at this time includes only the NH$_3$ gas and the N$_2$ gas. The NH$_3$ gas substitutes for at least a portion of the Ti-containing layer formed on the wafers 200 in the halogen-based source gas supply step. During substitution, Ti contained in the Ti-containing layer and N contained in the NH$_3$ gas bond together to form a TiN layer containing Ti and N on the wafers 200.

Residual Gas Removal Step

Subsequently, by the same processing as the above-described residual gas removal step after the halogen-based source gas supply step, unreacted NH$_3$ gas or NH$_3$ gas after contributing to the formation of the above-described TiN layer remaining in the processing chamber 201, and reaction by-products are removed from inside the processing chamber 201.

By performing, once or more (a predetermined number of times), a cycle in which the above-described organic source gas supply step, residual gas removal step, N-containing gas supply step, and residual gas removal step are time-divided and performed in order, that is, with processing of the organic source gas supply step, residual gas removal step, N-containing gas supply step, and residual gas removal step as one cycle, by performing these steps by $n_2$ cycles ($n_2$ is an integer not less than one), a TiN film (second TiN film) with a predetermined thickness (e.g., 0.1 to 10 nm) is formed on the wafers 200. The above-described cycle is preferably repeated more than once.

Performing Predetermined Number of Times

The above-described step of forming the first TiN film and the above-described step of forming the second TiN film are time-divided and performed by $n_3$ times ($n_3$ is an integer not less than one), thereby to form, on the wafers 200, a TiN film with a predetermined thickness (e.g., 1.0 to 20 nm) formed as a laminated film with first TiN films and second TiN films layered alternately. The above-described steps are preferably repeated more than once.

Here, the number of times the step of forming the first TiN film is performed (the above-described $n_1$ times) and the number of times the step of forming the second TiN film is performed (the above-described $n_2$ times) allow for the adjustment of the ratio of elements contained in a TiN film finally formed. Specifically, by adjusting the number of times the TiCl$_4$ gas, a halogen-based source gas, is used as a metal-containing gas containing titanium as a metal element (the above-described $n_1$ times) and the number of times the TDEAT gas is used (the above-described $n_2$ times), the ratio of Ti, N, C, H, and Cl, or the like, the elements derived from the sources contained in a finally formed TiN film can be adjusted. That is, by adjusting the number of times of each processing, the work function of a gate electrode made from a TiN film can be tuned (adjusted or modulated). In other words, the values of $n_1$ and $n_2$ are determined according to the ratio of the elements to be contained in a TiN film.

Therefore, by determining the values of the above-described $n_1$ and $n_2$ according to the ratio of the elements to be contained in a TiN film, a metal film having a desired work function can be formed.

Purge and Return to Atmospheric Pressure

The valves 514, 524, and 534 are opened to supply the N$_2$ gas from the gas supply pipes 510, 520, and 530, individually, into the processing chamber 201, and exhaust it from the exhaust pipe 231. The $N_2$ gas functions as a purge gas, thus the inside of the processing chamber 201 is purged by an inert gas, and gas remaining in the processing chamber 201 and by-products are removed from inside the processing chamber 201 (purge). Thereafter, the atmosphere in the processing chamber 201 is substituted by the inert gas (inert gas substitution), and the pressure in the processing chamber 201 is returned to atmospheric pressure (return to atmospheric pressure).

Boat Unload and Wafer Discharge

Thereafter, the seal cap 219 is lowered by the boat elevator 115 to open the bottom of the reaction tube 203. Then, the processed wafers 200 in a state of being supported on the boat 217 are carried out of the reaction tube 203 through the bottom of the reaction tube 203 (boat unload). Thereafter, the processed wafers 200 are taken out of the boat 217 (wafer discharge).

(3) Effects by this Embodiment

This embodiment provides one or more effects presented below.

In this embodiment, the composition ratio of elements such as Ti, N, C, H, and Cl can be adjusted by the thickness ratio of films of a laminated film including first TiN films and second TiN films, and the work function can be controlled. That is, this embodiment can improve the controllability of the atomic concentration of each element (such as Ti, N, C, H, and Cl) contained in a TiN film finally obtained, and thus can improve the controllability of the work function of a TiN film.

Further, in this embodiment, to form a film, when layers containing a metal element among elements to constitute a main composition of the film to be formed are formed on a substrate, by selecting, as metal-containing source gases to be used, those having different compositions such as a halogen-based source gas and an organic source gas, for example, the composition ratio of elements derived from the source gases contained in the film formed on the substrate can be adjusted.

The above-described effects can also be provided when a halogen-based source gas other than the $TiCl_4$ gas is used as a source gas, when an organic source gas other than the TDEAT gas is used, and when an N-containing gas other than the $NH_3$ gas is used as a reaction gas.

Second Embodiment of the Present Invention

In the first embodiment, a description has been made of an example in which a first TiN film is formed using the $TiCl_4$ gas, a halogen-based source gas, and the $NH_3$ gas, an N-containing gas, and a second TiN film is formed using the TDEAT gas, an organic source gas, and the $NH_3$ gas, an N-containing gas, to form a final TiN film. A second embodiment will be described below on differences from the first embodiment, and will not be described in detail on portions similar to those in the first embodiment.

Figure 5:
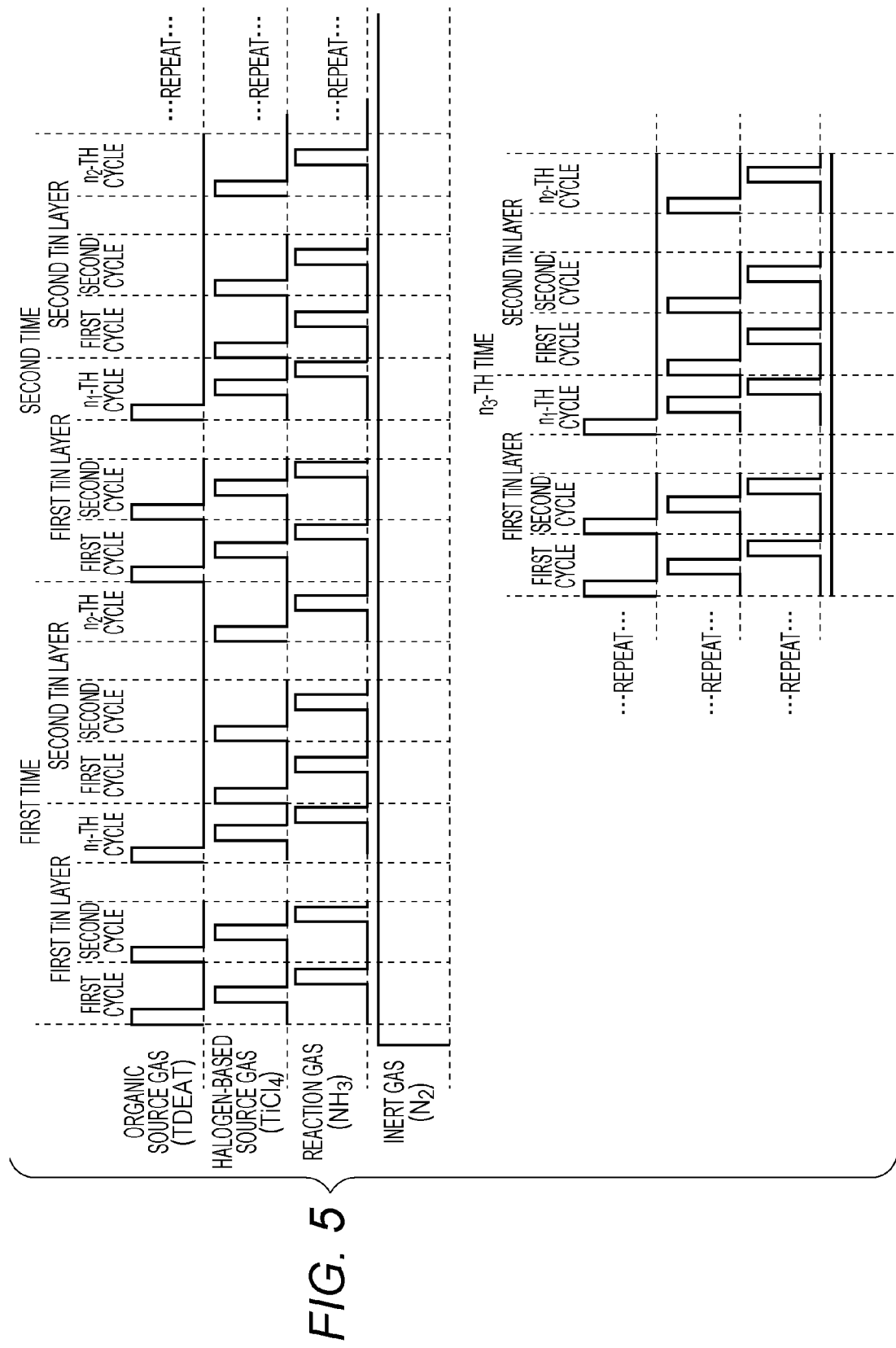
FIG. 5 is a diagram illustrating a sequence in a second embodiment of the present invention.

In this embodiment, as shown in FIG. 5, with a cycle of an organic source gas supply step, a residual gas removal step, an N-containing gas supply step, and a residual gas removal step as one cycle, they are time-divided and performed in order in $n_1$ cycles ($n_1$ is an integer not less than one), and then, with a cycle of an N-containing gas supply step, a residual gas removal step, an organic source gas supply step, and a residual gas removal step as one cycle, they are time-divided and performed in order in $n_2$ cycles ($n_2$ is an integer not less than one). These are repeated $n_3$ times ($n_3$ is an integer not less than one), thereby to form a TiN film on the wafers 200.

As in this embodiment, by first passing an organic source gas instead of a halogen-based source gas, it is expected that the wettability of a substrate is improved, or the surface energy of crystal nuclei is reduced so that the nuclear density becomes dense. Therefore, an effect of improving surface roughness of a film can be obtained.

Third Embodiment of the Present Invention

Portions similar to those in the first embodiment will not be described in detail, and differences from the first embodiment will be described below.

Figure 6:
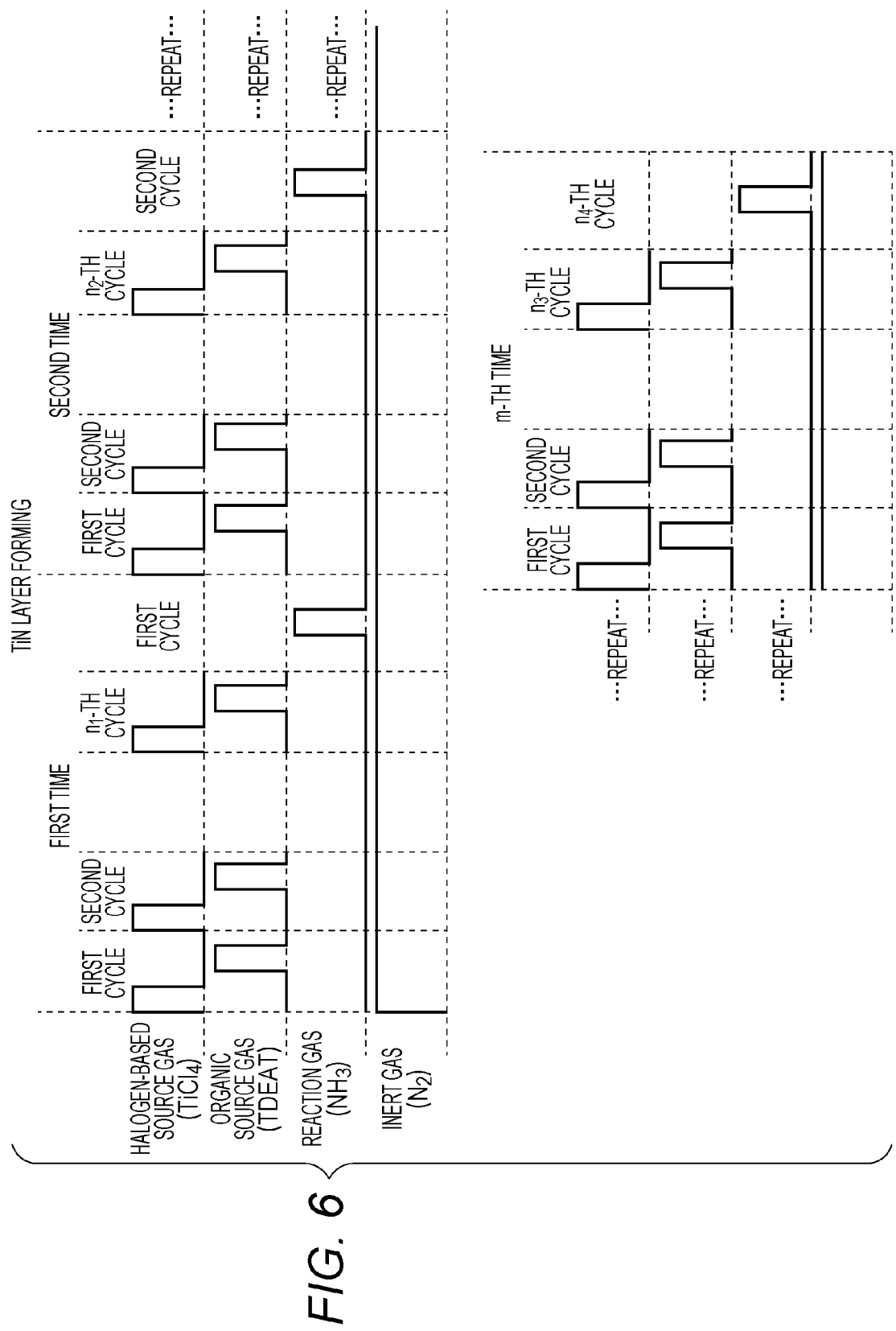
FIG. 6 is a diagram illustrating a sequence in a third embodiment of the present invention.

In this embodiment, as shown in FIG. 6, with a cycle of a halogen-based source gas supply step, a residual gas removal step, an organic source gas supply step, and a residual gas removal step as one cycle, they are time-divided and performed in order in $n_1$ cycles ($n_1$ is an integer not less than one), and then an N-containing gas supply step is performed in one cycle. These are repeated m times (m is an integer not less than one), thereby to form a TiN film on the wafers 200.

Fourth Embodiment of the Present Invention

Portions similar to those in the first embodiment will not be described in detail, and differences from the first embodiment will be described below.

Figure 7:
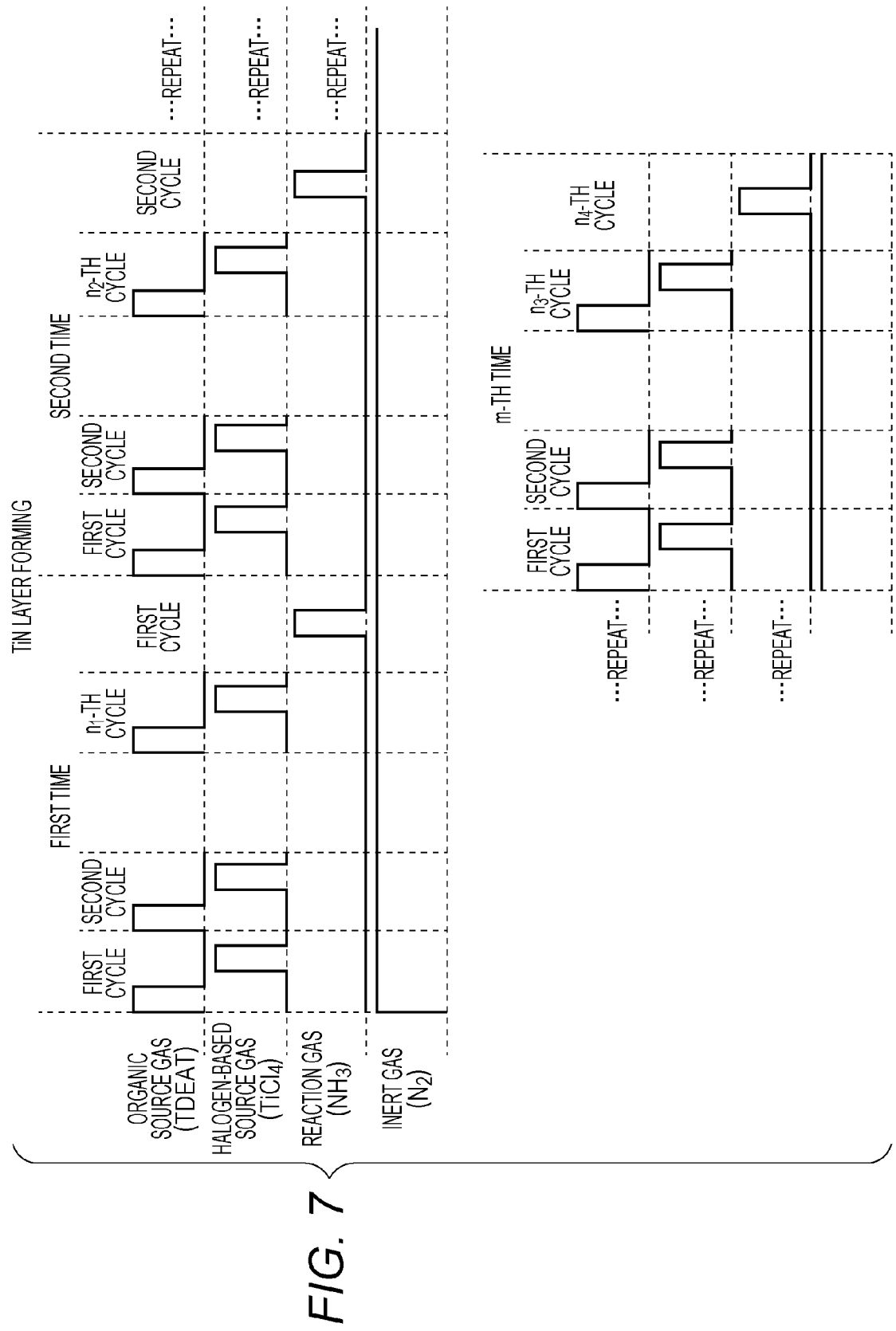
FIG. 7 is a diagram illustrating a sequence in a fourth embodiment of the present invention.

In this embodiment, as shown in FIG. 7, with a cycle of an organic source gas supply step, a residual gas removal step, a halogen-based source gas supply step, and a residual gas removal step as one cycle, they are time-divided and performed in order in $n_1$ cycles ($n_1$ is an integer not less than one), and then an N-containing gas supply step is performed in one cycle. These are repeated m times (m is an integer not less than one), thereby to form a TiN film on the wafers 200.

As in each embodiment, each processing is performed a predetermined number of times, thereby to form a TiN film on a wafer. At this time, by controlling the number of times each cycle is performed, the composition ratio of elements such as Ti, N, C, H, and Cl contained in a TiN film finally formed can be adjusted, and the work function can be controlled.

Other Embodiments of the Present Invention

The above-described embodiments can be combined appropriately for use. Further, the present invention is not limited to the above-described embodiments, and can be changed variously without departing from the scope thereof.

In the above-described embodiments, a description has been made of an example of using Ti as a metal element. The present invention is not limited to the above-described embodiments, and can be preferably applied to a case where a film containing an element such as tantalum (Ta) or silicon (Si) as an element other than Ti is formed.

For example, applicable films include a metal carbonitride-based film such as a TiCN film, a doped-TiCN film, a TaN film, a TaCN film, a doped-TaCN film, a SiCN film, and a SiOCN film, a metal nitride-based film, a silicon carbonitride-based film, and a silicon oxycarbonitride-based film.

As a halogen-based source gas, for example, besides $TiCl_4$, titanium tetrafluoride ($TiF_4$), tantalum pentachloride ($TaCl_5$), tantalum pentafluoride ($TaF_5$), silicon tetrachloride ($SiCl_4$), dichlorosilane ($SiH_2Cl_2$), disilicon hexachloride ($Si_2Cl_6$), and the like can be used.

As an organic source gas, for example, besides TDEAT, tetrakis(dimethylamino)titanium (TDMAT, $Ti[N(CH_3)_2]_4$), tetrakis(diethylamino)titanium (TDEAT, Ti[N(C$_2$H$_5$)$_2$]$_4$), pentaethoxy tantalum (PET, Ta(OC$_2$H$_5$)$_5$), tris(dimethylamino)silane (TDMAS, Si[N(CH$_3$)$_2$]$_3$H), bis-tertiary-butyl-amino-silane (BTBAS), bis-diethyl-amino-silane (BDEAS), bis-diethyl-methyl-amino-silane (BDEMAS), and the like can be used.

As a reaction gas, for example, besides NH$_3$, triethylamine (TEA), diethylamine (DEA), dimethylamine (DMA), tertiary-butylamine (TBA), and the like can be used.

In the above-described embodiments, an example of using the N$_2$ gas as an inert gas has been described, which is not limiting. A noble gas such as an Ar gas, an He gas, an Ne gas, or an Xe gas may be used.

In the above-described embodiments, a description has been made of an example of forming a film using a processing furnace that has a structure in which nozzles for supplying processing gases into a single reaction tube are erected, and an exhaust opening is provided at a lower portion of the reaction tube, which is a substrate processing apparatus, a batch-type vertical apparatus for processing a plurality of substrates at a time. The present invention can also be applied to a case of forming a film using a processing furnace having a different structure. For example, the present invention can also be applied to a case of forming a film using a processing furnace having two reaction tubes with concentric sections (an outside reaction tube is referred to as an outer tube, and an inside reaction tube as an inner tube), and having a structure in which processing gases flow from nozzles erected in the inner tube to an exhaust opening opened in a side wall of the outer tube in a position facing the nozzles across substrates (line-symmetric position). Further, processing gases may be supplied from gas supply openings opened in a side wall of the inner tube, instead of being supplied from the nozzles erected in the inner tube. In this case, the exhaust opening opened in the outer tube may be opened according to the height along which the plurality of substrates accommodated in layers in the processing chamber is present. The shape of the exhaust opening may be a hole shape or a slit shape.

In the above-described embodiments, a description has been made of an example of forming a film using a substrate processing apparatus that is a batch-type vertical apparatus to process a plurality of substrates at a time. However, the present invention is not limited to this, and can also be preferably applied to a case of forming a film using a single-substrate processing-type substrate processing apparatus to process one or several substrates at a time. In the above-described embodiments, a description has been made of an example of forming a thin film using a substrate processing apparatus having a hot wall-type processing furnace. However, the present invention is not limited to this, and can also be preferably applied to a case of forming a thin film using a substrate processing apparatus having a cold wall-type processing furnace. In these cases also, processing conditions may be made similar to those in the above-described embodiments, for example.

Figure 8:
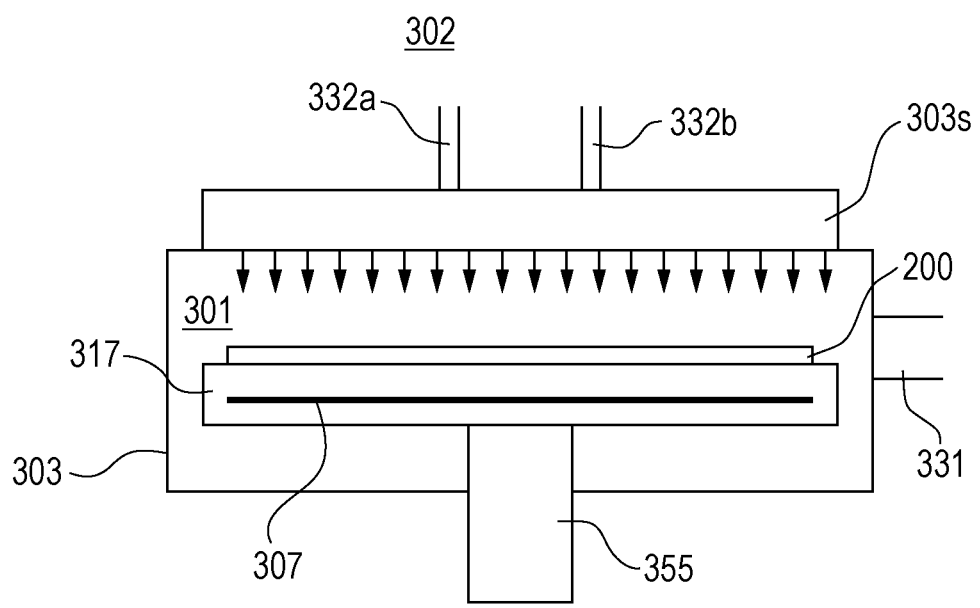
FIG. 8 is a schematic configuration diagram of a processing furnace of a substrate processing apparatus preferably used in another embodiment of the present invention, a diagram illustrating a processing furnace portion in a longitudinal section.

For example, the present invention can also be preferably applied to a case of forming a film using a substrate processing apparatus with a processing furnace 302 shown in FIG. 8. The processing furnace 302 includes a processing container 303 forming a processing chamber 301, a shower head 303s for supplying gas into the processing chamber 301 in the form of a shower, a support table 317 for supporting one or several wafers 200 in a horizontal position, a rotating shaft 355 supporting the support table 317 from below, and a heater 307 provided in the support table 317. A gas supply port 332a for supplying the above-described source gases and a gas supply port 332b for supplying the above-described reaction gas are connected to an inlet (gas introduction opening) of the shower head 303s. A source gas supply system similar to the source gas supply system in the above-described embodiments is connected to the gas supply port 332a. A reaction gas supply system similar to the reaction gas supply system in the above-described embodiments is connected to the gas supply port 332b. A gas dispersion plate for supplying gas into the processing chamber 301 in the form of a shower is provided to an outlet (gas exhaust opening) of the shower head 303s. An exhaust port 331 for exhausting gas from inside the processing chamber 301 is provided to the processing container 303. An exhaust system similar to the exhaust system in the above-described embodiments is connected to the exhaust port 331.

Figure 9:
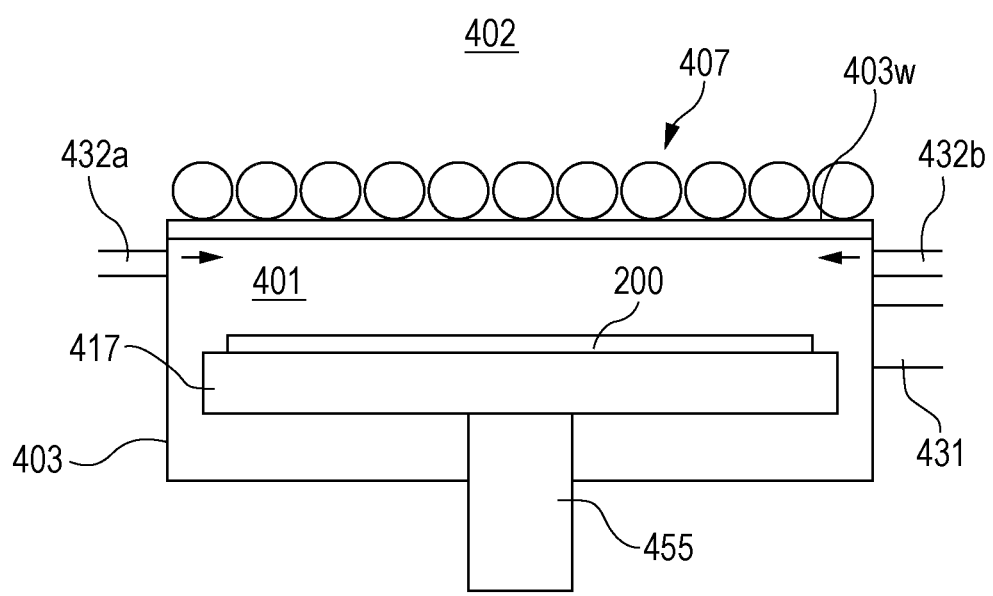
FIG. 9 is a schematic configuration diagram of a processing furnace of a substrate processing apparatus preferably used in another embodiment of the present invention, a diagram illustrating a processing furnace portion in a longitudinal section.

Alternatively, for example, the present invention can be preferably applied to a case of forming a film using a substrate processing apparatus with a processing furnace 402 shown in FIG. 9. The processing furnace 402 includes a processing container 403 forming a processing chamber 401, a support table 417 for supporting one or several wafers 200 in a horizontal position, a rotating shaft 455 supporting the support table 417 from below, a lamp heater 407 for irradiating the wafer 200 in the processing container 403 with light, and a quartz window 403w to transmit light of the lamp heater 407. A gas supply port 432a for supplying the above-described source gases and a gas supply port 432b for supplying the above-described reaction gas are connected to the processing container 403. A source gas supply system similar to the source gas supply system in the above-described embodiments is connected to the gas supply port 432a. A reaction gas supply system similar to the reaction gas supply system in the above-described embodiments is connected to the gas supply port 432b. An exhaust port 431 for exhausting gas from inside the processing chamber 401 is provided to the processing container 403. An exhaust system similar to the exhaust system in the above-described embodiments is connected to the exhaust port 431.

When these substrate processing apparatuses are used, film-forming can be performed in a sequence and under processing conditions similar to those in the above-described embodiments and modifications.

It is preferable to prepare independent (prepare a plurality of) process recipes (programs describing processing processes, process conditions, and the like) to be used for formation of these various types of thin films, according to the respective details of substrate processing (such as the type of a thin film to be formed, a composition ratio, a film quality, a film thickness, a processing process, and processing conditions). To start substrate processing, it is preferable to appropriately select a proper process recipe from among the plurality of process recipes, according to the details of the substrate processing. Specifically, a plurality of process recipes prepared independently according to the details of substrate processing is preferably previously stored (installed) in the memory device 121c included in the substrate processing apparatus via a telecommunications line or a non-transitory computer-readable recording medium (external memory device 123) in which the process recipes are recorded. To start substrate processing, the CPU 121a included in the substrate processing apparatus preferably selects a proper process recipe appropriately, according to the details of the substrate processing, from among the plurality of process recipes stored in the memory device 121c. This configuration allows a single substrate processing apparatus to form thin films of various types, composition ratios, qualities, and thicknesses versatilely and reproducibly. Further, the operation load of an operator (such as the load of inputting a processing process, processing conditions, and the like) can be reduced to speedily start substrate processing, avoiding operating errors.

Further, the present invention can be realized by changing a process recipe of an existing substrate processing apparatus, for example. When a process recipe is changed, a process recipe according to the present invention can be installed in an existing substrate processing apparatus via a telecommunications line or a non-transitory computer-readable recording medium in which the process recipe is recorded, or by operating an input/output device of the existing substrate processing apparatus, its process recipe itself can be changed to a process recipe according to the present invention.

Hereinafter, desirable forms of the present invention will be added.

Supplementary Note 1

According to an aspect of the present invention, there are provided a method of manufacturing a semiconductor device and a substrate processing method that include:
- (a) supplying a halogen-based source gas containing a first element to a substrate;
- (b) supplying a reaction gas containing a second element to react with the first element to the substrate;
- (c) forming a first layer containing the first element and the second element by time-dividing and (asynchronously, intermittently, pulsatively) performing (a) and (b) a predetermined number of times;
- (d) supplying an organic source gas containing the first element to the substrate;
- (e) supplying the reaction gas to the substrate;
- (f) forming a second layer containing the first element and the second element by time-dividing and (asynchronously, intermittently, pulsatively) performing (d) and (e) a predetermined number of times; and
- (g) forming a thin film containing the first element and the second element on the substrate by time-dividing and (asynchronously, intermittently, pulsatively) performing (c) and (f) a predetermined number of times.

Supplementary Note 2

The methods described in Supplementary Note 1, in which, preferably, the first element is a metal element, and the work function of the thin film is controlled by controlling the number of times the first layer forming is performed and the number of times the second layer forming is performed.

Supplementary Note 3

The methods described in Supplementary Note 2, in which, preferably, the first element is titanium.

Supplementary Note 4

The methods described in Supplementary Note 1, in which, preferably, the concentration of at least one of carbon, nitrogen, and chlorine contained in the thin film is controlled by controlling the number of times the first layer forming is performed and the number of times the second layer forming is performed.

Supplementary Note 5

The methods described in any one of Supplementary Notes 2 to 4, in which, preferably, the reaction gas is a nitrogen-containing gas.

Supplementary Note 6

The methods described in Supplementary Note 4, in which, preferably, the reaction gas is a nitrogen-containing gas, and the concentration of at least one of carbon, nitrogen, and chlorine contained in the thin film is controlled by controlling the number of times the first layer forming is performed and the number of times the second layer forming is performed.

Supplementary Note 7

The methods described in Supplementary Note 1, in which, preferably, the first element is a metal element, and the crystallinity of the thin film is controlled by controlling the number of times the first layer forming is performed and the number of times the second layer forming is performed.

Supplementary Note 8

The methods described in Supplementary Note 1, in which, preferably, the first element is a metal element, and the work function and the crystallinity of the thin film is controlled by controlling the number of times the first layer forming is performed and the number of times the second layer forming is performed.

Supplementary Note 9

According to another aspect of the present invention, there are provided a method of manufacturing a semiconductor device and a substrate processing method that include:
- (a) supplying an organic source gas containing a first element to a substrate;
- (b) supplying a halogen-based source gas containing the first element to the substrate;
- (c) supplying a reaction gas containing a second element to react with the first element to the substrate;
- (d) forming a first layer containing the first element and the second element by time-dividing and (asynchronously, intermittently, pulsatively) performing (a), (b), and (c) a predetermined number of times;
- (e) supplying the halogen-based source gas to the substrate;
- (f) supplying the reaction gas to the substrate;
- (g) forming a second layer containing the first element and the second element by time-dividing and (asynchronously, intermittently, pulsatively) performing (e) and (f) a predetermined number of times; and
- (h) forming a thin film containing the first element and the second element on the substrate by time-dividing and (asynchronously, intermittently, pulsatively) performing (d) and (g) a predetermined number of times.

Supplementary Note 10

According to another aspect of the present invention, there are provided a method of manufacturing a semiconductor device and a substrate processing method that include:
- (a) supplying an organic source gas containing a first element to a substrate;
- (b) supplying a halogen-based source gas containing the first element to the substrate;
- (c) forming a first layer containing the first element by time-dividing and (asynchronously, intermittently, pulsatively) performing (a) and (b) a predetermined number of times;

(d) forming a second layer containing the first element and a second element by supplying a reaction gas containing the second element to react with the first element to the substrate a predetermined number of times; and (e) forming a thin film containing the first element and the second element on the substrate by time-dividing and (asynchronously, intermittently, pulsatively) performing (c) and (d) a predetermined number of times.

Supplementary Note 11

According to another aspect of the present invention, there are provided a method of manufacturing a semiconductor device and a substrate processing method that include:

(a) supplying a halogen-based source gas containing a first element to a substrate;

(b) supplying an organic source gas containing the first element to the substrate;

(c) forming a first layer containing the first element by time-dividing and (asynchronously, intermittently, pulsatively) performing (a) and (b) a predetermined number of times;

(d) forming a second layer containing the first element and a second element by supplying a reaction gas containing the second element to react with the first element to the substrate a predetermined number of times; and (e) forming a thin film containing the first element and the second element on the substrate by time-dividing and (asynchronously, intermittently, pulsatively) performing (c) and (d) a predetermined number of times.

Supplementary Note 12

According to another aspect of the present invention, there is provided a substrate processing apparatus that includes:

a processing chamber configured to accommodate a substrate;

a gas supply system configured to supply, to the substrate, a halogen-based source gas containing a first element, an organic source gas containing the first element, and a reaction gas containing a second element to react with the first element; and a controller configured to control the gas supply system to perform:

(a) processing of supplying the halogen-based source gas to the substrate accommodated in the processing chamber;

(b) processing of supplying the reaction gas to the substrate; p1 (c) processing of forming a first layer containing the first element and the second element by time-dividing and (asynchronously, intermittently, pulsatively) performing (a) and (b) a predetermined number of times;

(d) processing of supplying the organic source gas to the substrate;

(e) processing of supplying the reaction gas to the substrate;

(f) processing of forming a second layer containing the first element and the second element by time-dividing and (asynchronously, intermittently, pulsatively) performing (d) and (e) a predetermined number of times; and (g) forming a thin film containing the first element and the second element on the substrate by time-dividing and (asynchronously, intermittently, pulsatively) performing (c) and (f) a predetermined number of times.

Supplementary Note 13

According to another aspect of the present invention, there is provided a substrate processing apparatus that includes:

a processing chamber configured to accommodate a substrate;

a gas supply system configured to supply, to the substrate, a halogen-based source gas containing a first element, an organic source gas containing the first element, and a reaction gas containing a second element to react with the first element; and a controller configured to control the gas supply system to perform:

(a) processing of supplying the organic source gas to the substrate accommodated in the processing chamber;

(b) processing of supplying the halogen-based source gas to the substrate;

(c) processing of supplying the reaction gas to the substrate;

(d) processing of forming a first layer containing the first element and the second element by time-dividing and (asynchronously, intermittently, pulsatively) performing (a), (b), and (c) a predetermined number of times;

(e) processing of supplying the halogen-based source gas to the substrate;

(f) processing of supplying the reaction gas to the substrate;

(g) processing of forming a second layer containing the first element and the second element by time-dividing and (asynchronously, intermittently, pulsatively) performing (e) and (f) a predetermined number of times; and (h) forming a thin film containing the first element and the second element on the substrate by time-dividing and (asynchronously, intermittently, pulsatively) performing (d) and (g) a predetermined number of times.

Supplementary Note 14

According to another aspect of the present invention, there is provided a substrate processing apparatus that includes:

a processing chamber configured to accommodate a substrate;

a gas supply system configured to supply, to the substrate, a halogen-based source gas containing a first element, an organic source gas containing the first element, and a reaction gas containing a second element to react with the first element; and a controller configured to control the gas supply system to perform:

(a) processing of supplying the halogen-based source gas to the substrate accommodated in the processing chamber;

(b) processing of supplying the organic source gas to the substrate;

(c) processing of forming a first layer containing the first element by time-dividing and (asynchronously, intermittently, pulsatively) performing (a) and (b) a predetermined number of times;

(d) processing of forming a second layer containing the first element and the second element by performing processing of supplying the reaction gas to the substrate a predetermined number of times; and (e) forming a thin film containing the first element and the second element on the substrate by time-dividing and (asynchronously, intermittently, pulsatively) performing (c) and (d) a predetermined number of times.

Supplementary Note 15

According to another aspect of the present invention, there are provided a program and a non-transitory computer-readable recording medium in which the program is recorded, the program being configured to cause a computer to perform:
  (a) a process of supplying a halogen-based source gas containing a first element to a substrate;
  (b) a process of supplying a reaction gas containing a second element to react with the first element to the substrate;
  (c) a process of forming a first layer containing the first element and the second element by time-dividing and (asynchronously, intermittently, pulsatively) performing (a) and (b) a predetermined number of times;
  (d) a process of supplying an organic source gas containing the first element to the substrate;
  (e) a process of supplying the reaction gas to the substrate;
  (f) a process of forming a second layer containing the first element and the second element by time-dividing and (asynchronously, intermittently, pulsatively) performing (d) and (e) a predetermined number of times; and
  (g) a process of forming a thin film containing the first element and the second element on the substrate by time-dividing and (asynchronously, intermittently, pulsatively) performing (c) and (f) a predetermined number of times.

As described above, the present invention can be used for a method of manufacturing a semiconductor device, a substrate processing apparatus for processing a substrate such as a semiconductor wafer or a glass substrate, and the like.

What is claimed is:

1. A method of manufacturing a semiconductor device comprising:
  (a) supplying a halogen-based source gas containing a first element to a substrate;
  (b) supplying a reaction gas containing a second element to react with the first element to the substrate;
  (c) forming a first layer containing the first element and the second element by time-dividing and performing (a) and (b) a predetermined number of times;
  (d) supplying an organic source gas containing the first element to the substrate;
  (e) supplying the reaction gas to the substrate;
  (f) forming a second layer containing the first element and the second element by time-dividing and performing (d) and (e) a predetermined number of times; and
  (g) forming a thin film containing the first element and the second element on the substrate by time-dividing and performing (c) and (f) a predetermined number of times.

2. The method according to claim 1, wherein the first element is a metal element, and the work function of the thin film is controlled by controlling the number of times the first layer forming is performed and the number of times the second layer forming is performed.

3. The method according to claim 2, wherein the first element is titanium.

4. The method according to claim 1, wherein the concentration of at least one of carbon, nitrogen, and chlorine contained in the thin film is controlled by controlling the number of times the first layer forming is performed and the number of times the second layer forming is performed.

5. The method according to claim 4, wherein the reaction gas is a nitrogen-containing gas.

6. The method according to claim 5, wherein the concentration of at least one of carbon, nitrogen, and chlorine contained in the thin film is controlled by controlling the number of times the first layer forming is performed and the number of times the second layer forming is performed.

7. The method according to claim 1, wherein the first element is a metal element, and the crystallinity of the thin film is controlled by controlling the number of times the first layer forming is performed and the number of times the second layer forming is performed.

8. The method according to claim 1, wherein the first element is a metal element, and the work function of the thin film is controlled by controlling the number of times the first layer forming is performed and the number of times the second layer forming is performed.

9. A method of manufacturing a semiconductor device comprising:
  (a) supplying an organic source gas containing a first element to a substrate;
  (b) supplying a halogen-based source gas containing the first element to the substrate;
  (c) supplying a reaction gas containing a second element to react with the first element to the substrate;
  (d) forming a first layer containing the first element and the second element by time-dividing and performing (a), (b), and (c) a predetermined number of times;
  (e) supplying the halogen-based source gas to the substrate;
  (f) supplying the reaction gas to the substrate;
  (g) forming a second layer containing the first element and the second element by time-dividing and performing (e) and (f) a predetermined number of times; and
  (h) forming a thin film containing the first element and the second element on the substrate by time-dividing and performing (d) and (g) a predetermined number of times.

10. The method according to claim 9, wherein the concentration of at least one of carbon, nitrogen, and chlorine contained in the thin film is controlled by controlling the number of times the first layer forming is performed and the number of times the second layer forming is performed.

11. A method of manufacturing a semiconductor device and a substrate processing method that include:
  (a) supplying an organic source gas containing a first element to a substrate;
  (b) supplying a halogen-based source gas containing the first element to the substrate;
  (c) forming a first layer containing the first element by time-dividing and performing (a) and (b) a predetermined number of times;
  (d) forming a second layer containing the first element and a second element by supplying a reaction gas containing the second element to react with the first element to the substrate a predetermined number of times;
  and (e) forming a thin film containing the first element and the second element on the substrate by time-dividing and performing (c) and (d) a predetermined number of times.

* * * * *